(12) United States Patent
Vyprintsev

(10) Patent No.: US 8,629,403 B2
(45) Date of Patent: Jan. 14, 2014

(54) INORGANIC SCINTILLATING MATERIAL, CRYSTAL SCINTILLATOR AND RADIATION DETECTOR

(75) Inventor: Dmitry Ivanovich Vyprintsev, Novosibirsk (RU)

(73) Assignee: Obshchestvo s Ogranichennoy Otvetstvennostyu "Scintillyatsionnye Tekhnologii Radiatsionnogo Kontrolya", Kaluzhskaya obl. (RU)

( * ) Notice: Subject to any disclaimer, the term of this patent is extended or adjusted under 35 U.S.C. 154(b) by 0 days.

(21) Appl. No.: 13/578,861

(22) PCT Filed: Feb. 3, 2011

(86) PCT No.: PCT/RU2011/000062
§ 371 (c)(1),
(2), (4) Date: Aug. 14, 2012

(87) PCT Pub. No.: WO2011/099893
PCT Pub. Date: Aug. 18, 2011

(65) Prior Publication Data
US 2012/0305779 A1 Dec. 6, 2012

(30) Foreign Application Priority Data
Feb. 15, 2010 (RU) .................. 2010105073

(51) Int. Cl.
*G01T 1/20* (2006.01)
(52) U.S. Cl.
USPC ................... 250/361 R; 250/370.11
(58) Field of Classification Search
USPC .................... 250/361 R, 370.11
See application file for complete search history.

(56) References Cited

U.S. PATENT DOCUMENTS

| | | | |
|---|---|---|---|
| 5,786,600 A * | 7/1998 | Lambert et al. ............ | 250/484.4 |
| 6,706,212 B2 * | 3/2004 | Venkataramani et al. . | 252/301.4 F |
| 7,067,815 B2 | 6/2006 | Dorenbos et al. | |
| 7,067,816 B2 | 6/2006 | Dorenbos et al. | |
| 7,233,006 B2 | 6/2007 | Dorenbos et al. | |
| 7,250,609 B2 | 7/2007 | Dorenbos et al. | |
| 7,479,637 B2 | 1/2009 | Dorenbos et al. | |
| 7,863,572 B1 * | 1/2011 | Doty ............................ | 250/361 R |
| 2003/0183806 A1 * | 10/2003 | Lyons ..................... | 252/301.4 F |
| 2005/0173676 A1 * | 8/2005 | Kurashige et al. ........ | 252/301.4 F |
| 2006/0054831 A1 * | 3/2006 | Shimizu et al. ........... | 250/370.11 |
| 2008/0067391 A1 | 3/2008 | Shimizu et al. | |
| 2008/0213151 A1 * | 9/2008 | Yoshikawa et al. ........... | 423/263 |
| 2009/0148375 A1 * | 6/2009 | Bourret-Courchesne et al. ........................... | 423/263 |
| 2010/0320391 A1 * | 12/2010 | Antonuk ...................... | 250/366 |
| 2011/0084233 A1 * | 4/2011 | Von Saldern et al. .. | 252/301.4 H |
| 2011/0084234 A1 * | 4/2011 | Von Saldern et al. .. | 252/301.4 H |
| 2011/0085957 A1 * | 4/2011 | Von Saldern et al. ......... | 423/263 |
| 2011/0133094 A1 * | 6/2011 | Seppi et al. .................. | 250/367 |
| 2012/0001074 A1 * | 1/2012 | Hardy et al. ............. | 250/361 R |

FOREIGN PATENT DOCUMENTS

| | | |
|---|---|---|
| CN | 1847469 | 10/2006 |
| WO | WO 01/60944 | 8/2001 |
| WO | WO 01/60945 | 8/2001 |
| WO | WO 2007/031583 | 3/2007 |

OTHER PUBLICATIONS

Zhang, Hongmei et al. Preparation of anhydrous lanthanum cerium chloride crystal, Guisuanyan Xuebao, 2008, 36 (5), 612-616 (abstract) [online] retrieved from DB STN, CA: 149:365202. (ISR).
International Search Report of PCT/RU2011/000062, Jun. 2, 2011.

* cited by examiner

*Primary Examiner* — David Porta
*Assistant Examiner* — Djura Malevic
(74) *Attorney, Agent, or Firm* — Collard & Roe, P.C.

(57) ABSTRACT

A new inorganic scintillating material is provided represented by the formula $Ln_{(1-m-n)}Hf_nCe_mA_{(3+n)}$, where A is Br or Cl, or I, or a mixture of at least two halogens of the group, Ln is an element from the group: La, Nd, Pm, Sm, Eu, Gd, Tb, Lu, Y. A new crystal scintillator is also provided represented by the formula $Ln_{(1-m)}Ce_mA_3:n.Hf^{4+}$, where $Ln_{(1-m)}Ce_mA_3$ represents the chemical composition of the matrix material, A is Br, or Cl, or I, or a mixture of at least two halogens from the group, Ln is an element from the group: La, Nd, Pm, Sm, Eu, Gd, Tb, Lu, Y; $Hf^{4+}$ is a dopant. A radiation detector comprising a scintillating element based on the novel inorganic scintillating material is also provided.

24 Claims, No Drawings

INORGANIC SCINTILLATING MATERIAL, CRYSTAL SCINTILLATOR AND RADIATION DETECTOR

CROSS REFERENCE TO RELATED APPLICATIONS

This application is the National Stage of PCT/RU2011/000062 filed on Feb. 3, 2011, which claims priority under 35 U.S.C. §119 of Russian Application No. 2010105073 filed on Feb. 15, 2010, the disclosure of which is incorporated by reference. The international application under PCT article 21(2) was published in English.

FIELD OF THE INVENTION

The invention pertains to new inorganic scintillating materials, primarily, to a crystal scintillator, in particular in the form of a single crystal, and to its use in detectors for gamma-rays, X-rays, cosmic rays etc.

BACKGROUND ART

Scintillating materials, especially in the form of single crystals, are widely used to detect ionizing radiation both in the form of electromagnetic waves of low energies and gamma-rays, X-rays, cosmic rays and particles. The scintillation mechanism relies on converting the energy of the incoming photons or particles into light which is within or reasonably close to the visible range, so it can be detected by standard photo-detectors. The key characteristics of crystal scintillators are their ability to absorb X-rays or gamma-rays, which to a first approximation is a function of $\rho \cdot Z^4$ (where $\rho$ is the density and Z is the effective atomic number), scintillation light yield, scintillation decay time and energy resolution. The shorter scintillation decay time the better time resolution of a detector. The smaller the numerical value of energy resolution the better the quality of a detector. Even an energy resolution of about 7% (a standard value for NaI) would suffice to obtain good results in solving certain types of problems. Of particular interest are monocrystalline scintillator types (scintillators in the form of single crystals). In order to be used efficiently such scintillators should be nontoxic, hard enough, and (which is very important) they should be nonhygroscopic.

Most known and most commonly used are scintillator crystals of sodium iodide type doped with thallium NaI(Tl), discovered by Robert Hofstadter in 1948. These materials offer high light yields of about 38000-40000 photons/Mev, they have been the basis of modern scintillators ever since and remain predominant in this field of application. Materials like NaI(Tl) are characterized by medium energy resolutions (about 7% at 662 key $^{137}$Cs), but they have high fluorescence decay time constant, that is equal to about 230 ns. Similarly, CsI(Tl) has a high decay time constant, it is longer than 500 ns. Scintillating materials of the NaI(Tl) type are highly hygroscopic, which is a decided practical disadvantage. Due to above reasons the development of new scintillating materials for improved performance still remains the topic of a large body of research.

In 2001 publications appeared (see below) about a new group of scintillators based on lanthanum halides doped with cerium, including the ones based on lanthanum chloride $LaCl_3$ and lanthanum bromide $LaBr_3$. These scintillators have decay time constants of about 20 ns and light yields comparable to those in materials of the NaI(Tl) type and even higher. There are rare earth element-based scintillating materials like $Ln_{1-x}Ce_xCl_3$ and $Ln_{1-x}Ce_xBr_3$, where Ln is chosen from lanthanoids or mixtures of lanthanoids and x is the molar level of substitution of Ln by cerium and there are radiation detectors using such scintillating materials (Patent applications PCT/EP01/01837 and PCT/EP01/01838 "Scintillator crystals, a process to manufacture them, the use of these crystals". Publications PCT WO 01/60944 of 23 Aug. 2001 and WO 01/60945 of 23 Aug. 2001). Specifically, single crystals of $LaCl_3$:Ce and $LaBr_3$:Ce offer short scintillation decay times with a fast scintillation component which are equal to 25-36 ns and an excellent energy resolution of about 2.9%-3.1%. However, in spite of all of the above virtues these scintillators have a decided disadvantage of being highly hygroscopic. Under atmospheric conditions the use of such crystals in radiation detectors without special moisture protection is highly problematic.

There is an inorganic scintillating material also available in the form of a single crystal which contains praseodymium halide and cerium halide and is of a general formula $Pr_{(1-x-y)}Ln_yCe_xX_3$, where Ln is chosen from the following group of elements: La, Nd, Pm, Sm, Eu, Gd, Y or their mixtures, X is chosen from the group of elements: Cl, Br, I or their mixtures, x is the molar level of substitution of praseodymium (Pr) by cerium, y is the molar level of substitution of praseodymium by lanthanum (Patent application PCT EP2006/066427). High Light Yield Fast Scintillator. Publication of the application PCT WO 2007/031583 of 22 Mar. 2007). The patent application also describes radiation detectors based on the said scintillating material. The scintillating material of the above invention, which is of interest for gamma radiation detection applications, is inferior to $LaBr_3$:Ce as claimed in WO 01/60945 with respect to energy resolution, but it is superior to $LaBr_3$:Ce with respect to count rate (more than 100 kcps (kilocounts per second) or even above 1 Mcps (megacounts per second)). Such material is of particular interest for high count rate detector applications, especially in PET (positron emission tomography) scanners. A disadvantage of the said material is that its energy resolution needs to be improved by producing material with good crystallinity and homogeneity using well controlled furnaces and an adequate choice of thermal conditions, of thermal gradients at the solid/liquid interface. The above materials are highly hygroscopic.

There are scintillation crystals of formula $Ln_{(1-y)}Ce_yX_3$:M, where $Ln_{(1-y)}Ce_yX_3$ is the chemical composition of the matrix material, Ln is one or more elements chosen from the group of rare earth elements, X is one or more elements from the group of halogens, M is a trace impurity element the matrix material is doped with, which can be one or more elements chosen from the group: Li, Na, K, Rb, Cs, Al, Zn, Ga, Be, Mg, Ca, Sr, Ba, Sc, Ge, Ti, V, Cu, Nb, Cr, Mn, Fe, Co, Ni, Mo, Ru, Rh, Pb, Ag, Cd, In, Sn, Sb, Ta, W, Re, Os, Ir, Pt, Au, Hg (US Patent application No2008/0067391, publication 2008 Mar. 20). The introduction of the above elements into the crystal matrix makes it possible to obtain crystals whose peak of scintillation intensity is shifted to longer wavelengths, which improves the operating efficiency of detectors based on such crystals and commonly used together with photomultipliers with a bialkali photocathode as the photo-detector. The chief drawback of the proposed scintillation crystals is their high hygroscopicity.

SUMMARY OF THE INVENTION

Present invention is aimed to develop nonhygroscopic inorganic scintillating materials, primarily crystal scintillators (and radiation detectors based on such scintillators) meeting the scintillator requirements of density and stopping power, short decay time, and good energy resolution.

Present invention provides for an inorganic halide scintillating material represented by the formula $$Ln_{(1-m-n)}Hf_nCe_mA_{(3+n)},$$

where A is either Br or Cl, or I, or a mixture of at least two halogens from the group,
Ln is an element from the group: La, Nd, Pm, Sm, Eu, Gd, Tb, Lu, Y,
m is the molar level of substitution of Ln by cerium,
n is the molar level of substitution of Ln by hafnium,
m and n are numerical values greater than 0 and less than 1,
the sum (m+n) is less than 1.

Preferably, m goes from 0.0005 to 0.3 (meaning that the molar level of substitution of Ln by cerium is preferably in the range from 0.05 to 30 mol %).

Preferably, n goes from 0.0005 to 0.015 (meaning that the molar level of substitution of Ln by hafnium is preferably in the range from 0.05 to 1.5 mol %).

The material wherein Ln is lanthanum (La) is preferred.
The material wherein Ln is lanthanum (La) and A is bromine (Br) is preferred.

For the material wherein Ln is lanthanum (La) and A is bromine (Br) preferably m goes from 0.005 to 0.1 (meaning that the molar level of substitution of Ln by cerium is preferably in the range from 0.5 to 10 mol %).

For the material wherein Ln is lanthanum (La) and A is bromine (Br) preferably n goes from 0.002 to 0.01 (meaning that the molar level of substitution of Ln by hafnium is preferably in the range from 0.2 to 1.0 mol %).

The scintillating material of the invention can be manufactured under the form of a monocrystal.

The volume of such monocrystal is generally at least 10 mm³.

The scintillating material according to the invention can also be used in the form of a powder (preferably polycrystalline).

The scintillating material according to the invention can be either compacted, e.g. packed, or sintered, or mixed with a binder.

Present invention provides also for a crystal scintillator represented by the formula $$Ln_{(1-m)}Ce_mA_3 \cdot n \cdot Hf^{4+},$$

where $Ln_{(1-m)}Ce_mA_3$ is the formula of the matrix material,
A is either Br, or Cl, or I, or a mixture of at least two halogens from the group,
Ln is an element from the group: La, Nd, Pm, Sm, Eu, Gd, Tb, Lu, Y,
$Hf^{4+}$ is a dopant,
m is a numerical value greater than 0 and less than or equal to 0.3,
n is the $Hf^{4+}$ dopant content (mol %), preferably 0.05 mol %-1.5 mol %.

The crystal scintillator wherein Ln is lanthanum (La) is preferred.

The crystal scintillator wherein A is bromine (Br) is preferred.

The crystal scintillator according to the invention can be manufactured under the form of a monocrystal.

In particular a monocrystal wherein Ln is lanthanum (La) and A is bromine (Br) is preferred.

The volume of a monocrystal is generally at least 10 mm³.

A radiation detector according to the present invention comprises a scintillating element based on an inorganic halide scintillating material of formula $$Ln_{(1-m-n)}Hf_nCe_mA_{(3+n)},$$

where A is either Br, or Cl, or I, or a mixture of at least two halogens from the group,
Ln is an element from the group: La, Nd, Pm, Sm, Eu, Gd, Tb, Lu, Y,
m is the molar level of substitution of Ln by cerium,
n is the molar level of substitution of Ln by hafnium,
m and n are numerical values greater than 0 and less than 1,
the sum (m+n) is less than 1,
and a photo-detector coupled to the scintillating element and doing the job of forming electrical signals in response to the light pulses produced by the scintillating element.

The preferred particulars of the qualitative and quantitative composition of the scintillating material from which the scintillating element of the invention is made are described above.

Preferably, the scintillating element should be made based on a single crystal.

In particular it is preferred that the scintillating element be made of a single crystal wherein Ln is lanthanum (La) and A is bromine (Br).

Preferably, the volume of the single crystal should be at least 10 mm³.

The scintillating element can be made from a scintillating material in the form of a powder, e.g. a polycrystalline powder.

The scintillating element can be made based on a scintillating material that is previously either compacted, e.g. packed, or sintered, or mixed with a binder.

The photo-detector may in particular be a photomultiplier, or else a photodiode.

DETAILED DESCRIPTION OF THE INVENTION

It is an object of the invention to develop an inorganic scintillating material, including a crystal scintillator, and a radiation detector comprising the new scintillating materials with desired scintillation properties, including density and stopping power, short decay time, good energy resolution and characterized by very low hygroscopicity. The optimum scintillation properties (short decay time and small numerical value of energy resolution) are attained because of the matrix material containing Ln halide compounds where part of Ln is substituted by cerium. To suppress hygroscopicity hafnium halide HfA₄ is introduced into the material. Hafnium ions will occupy the material lattice sites which are potentially ready to take water molecules. The Ln halide compounds analyzed in the invention have rather complex crystalline structures. E.g. lanthanum bromide has a hexagonal crystal lattice with pronounced cleavability. So the links between crystal planes are very weak, which manifests itself in lanthanum bromide-based materials' having a tendency to crack and a tendency to develop a system of channels when crystallized. It is the weak bonding in the material matrix that allows water molecules to penetrate into the structure of a crystal and dissolve it little by little. When hafnium ions are introduced into the matrix of the material the ingress of water molecules into the matrix is blocked, with a modified non-hygroscopic crystal structure being formed. When hygroscopicity of the material is reduced to a minimum the resulting radiation detectors life time under high air humidity conditions is increased.

The material of the invention can be produced in a variety of forms including the form of single crystals grown by well known processes such as the Bridgman method, or Kyropoulos or Czochralski techniques. In growing single crystals by the Bridgman technique in evacuated silica ampoules the purity qualification of the starting materials was 99.999. The material which was a mixture of the required quantities of the starting halide materials was loaded into the ampoule in a dry box. The ampoule with the material was evacuated and placed inside a 2-zone Bridgman furnace structurally divided into a hot zone and a cold zone (melting zone and crystallization zone). The rate of lowering the ampoule from the hot zone to the cold zone was about 2 mm/h. As a result transparent crystals were obtained with no inclusions. The crystals may comprise impurities usual in the technical field of the invention, the impurities usually coming from the raw material.

To analyze how the qualitative and quantitative composition of the new material affects its hygroscopicity and scintillation properties samples of the grown crystals were exposed to the air with about 50 percent humidity for several hours. Visually, hygroscopicity manifested itself in cloudiness of a crystal's surface and in the crystal's surface layer structure being changed. Quantitative characteristics related to these effects of hygroscopicity are changes in light yield and energy resolution of a crystal. Hafnium contents in the material that are lower than the lower limit of the range according to the invention (or no hafnium) result in the material exhibiting hygroscopic properties. Hafnium contents in the material that are higher than the upper limit of the range according to the invention result in a colored crystal being obtained and degraded scintillation properties (See examples and tables below).

The present invention is illustrated with, but in no way is limited to the examples below.

Example 1

Comparative

A $La_{0.95}Ce_{0.05}Br_3$ single crystal was produced by the Bridgman method. The crystal is transparent, it has no inclusions or cracks. The energy resolution is about 2.8%. The light yield of the grown crystal was assumed to be 100%. After being exposed to the air with about 50% humidity for 2 hours the surface of the crystal becomes cloudy and the structure of the surface changes. The light yield is 40% and the energy resolution is about 6.3%.

Example 2

A $La_{0.948}Hf_{0.002}Ce_{0.05}Br_{3.002}$ single crystal was produced by the Bridgman method. The crystal is transparent, it has no inclusions or cracks. The energy resolution is about 2.8%. The light yield was assumed to be 100%. After being exposed to the air with about 50% humidity for 4 hours the surface of the crystal did not change visually. The light yield is 96% and the energy resolution is about 2.9%.

Example 3

A $La_{0.986}Hf_{0.004}Ce_{0.01}Br_{3.004}$ single crystal was produced by the Bridgman method. The crystal is transparent, it has no inclusions or cracks. The energy resolution is about 2.9%. The light yield was assumed to be 100%. After being exposed to the air with about 50% humidity for 4 hours the surface of the crystal did not change visually. The light yield is 96% and the energy resolution is about 3.0%.

Example 4

A $La_{0.935}Hf_{0.015}Ce_{0.05}Br_{3.015}$ single crystal was produced by the Bridgman method. The crystal has no inclusions or cracks, but it is colored. The energy resolution is about 3.0%. The light yield was assumed to be 100%. After being exposed to the air with about 50% humidity for 4 hours the surface of the crystal did not change visually. The light yield is 97% and the energy resolution is about 3.1%.

Example 5

Comparative

A $La_{0.90}Ce_{0.10}Cl_3$ single crystal was produced by the Bridgman method. The crystal is transparent, it has no inclusions or cracks. The energy resolution is about 3.8%. The light yield was assumed to be 100%. After being exposed to the air with about 50% humidity for 2 hours the surface of the crystal becomes cloudy and the structure of the surface changes slightly. The light yield is 50% and the energy resolution is about 7%.

Example 6

A $La_{0.919}Hf_{0.001}Ce_{0.08}Cl_{3.001}$ single crystal was produced by the Bridgman method. The crystal is transparent, it has no inclusions or cracks. The energy resolution is about 4.2%. The light yield was assumed to be 100%. After being exposed to the air with about 50% humidity for 4 hours the surface of the crystal becomes a little cloudy. Visually, the structure of the surface remains unchanged. The light yield is 90% and the energy resolution is about 4.6%.

Example 7

A $La_{0.916}Hf_{0.004}Ce_{0.08}Cl_{3.004}$ single crystal was produced by the Bridgman method. The crystal is transparent, it has no inclusions or cracks. The energy resolution is about 4.3%. The light yield was assumed to be 100%. After being exposed to the air with about 50% humidity for 4 hours visually the surface of the crystal remains unchanged. The light yield is 94% and the energy resolution is about 4.4%.

Example 8

A $La_{0.905}Hf_{0.015}Ce_{0.08}Cl_{3.015}$ single crystal was produced by the Bridgman method. The crystal is colored, it has no inclusions or cracks. The energy resolution is about 4.4%. The light yield was assumed to be 100%. After being exposed to the air with about 50% humidity for 4 hours visually the surface of the crystal remains unchanged. The light yield is 96% and the energy resolution is about 4.5%.

Example 9

Comparative

A $La_{0.95}Ce_{0.05}I_3$ single crystal was produced by the Bridgman method. The crystal is transparent, it has no inclusions or cracks. The energy resolution is about 5.3%. The light yield was assumed to be 100%. After being exposed to the air with about 50% humidity for 2 hours the surface of the crystal becomes cloudy, the degree of cloudiness being different for different crystallographic directions. The surface structure is changed. The light yield is 48% and the energy resolution is about 7.2%.

Example 10

A $La_{0.945}Hf_{0.945}Ce_{0.005}Ce_{0.05}I_{3.005}$ single crystal was produced by the Bridgman method. The crystal is transparent, it has no inclusions or cracks. The energy resolution is about 5.4%. The light yield was assumed to be 100%. After being exposed to the air with about 50% humidity for 4 hours visually the surface of the crystal remains unchanged. The light yield is 95% and the energy resolution is about 5.5%.

The compounds with other Ln elements were obtained in the manner similar to the one used in the above examples. In order to make them more descriptive and facilitate their comparison the properties of the compounds according to the invention are shown in Tables 1 and 2 below, where energy resolution, decay time, and crystal surface are denoted by ER, DT and Srf respectively. In these tables AA (axial anisotropy) refers to the axial anisotropy of the rate of surface degradation (the present invention is illustrated with, but in no way is limited to the above examples).

TABLE 1

| Compound 1 | Light yield (photon/MeV) 2 | ER for Cs137 3 | Light yield after exposure (percent) 4 | ER after exposure 5 | DT (ns) 6 | Hygroscopicity 7 | Time of exposure Srf changes 8 |
|---|---|---|---|---|---|---|---|
| $La_{(1-m-n)}Hf_nCe_mBr_{(3+n)}$ | | | | | | | |
| $La_{0.95}Ce_{0.05}Br_3$ | 63000 | 2.8 | 40 | 6.3 | 18 | hygrosc. | T = 2 h. Srf clouded, Srf structure changed |
| $La_{0.948}Hf_{0.002}Ce_{0.05}Br_{3.002}$ | 62000 | 2.8 | 96 | 2.9 | 18 | nonhygr. | T = 4 h. Srf not changed |
| $La_{0.986}Hf_{0.004}Ce_{0.01}Br_{3.004}$ | 60000 | 2.9 | 96 | 3.0 | 20 | nonhygr. | T = 4 h. Srf not changed |
| $La_{0.935}Hf_{0.015}Ce_{0.05}Br_{3.015}$ | 60000 | 3.0 | 97 | 3.1 | 21 | nonhygr. | T = 4 h. Srf not changed Crystal colored |
| $La_{(1-m-n)}Hf_nCe_mCl_{(3+n)}$ | | | | | | | |
| $La_{0.90}Ce_{0.10}Cl_3$ | 45000 | 3.8 | 50 | 7 | 20 | hygrosc. | T = 2 h. Srf clouded, Srf structure changed |
| $La_{0.919}Hf_{0.001}Ce_{0.08}Cl_{3.001}$ | 44000 | 4.2 | 90 | 4.6 | 21 | slightly hygrosc. | T = 4 h. Srf clouded slightly, Srf structure not changed |
| $La_{0.916}Hf_{0.004}Ce_{0.08}Cl_{3.004}$ | 43000 | 4.3 | 94 | 4.4 | 22 | nonhygr. | T = 4 h. Srf not changed |
| $La_{0.905}Hf_{0.015}Ce_{0.08}Cl_{3.015}$ | 41000 | 4.4 | 96 | 4.5 | 22 | nonhygr. | T = 4 h. Srf not changed, crystal colored |
| $La_{(1-m-n)}Hf_nCe_mI_{(3+n)}$ | | | | | | | |
| $La_{0.95}Ce_{0.05}I_3$ | 31000 | 5.3 | 48 | 7.2 | 24 | hygrosc. AA | T = 2 h. Srf clouded, Srf structure changed |
| $La_{0.945}Hf_{0.005}Ce_{0.05}I_{3.005}$ | 30000 | 5.4 | 95 | 5.5 | 24 | nonhygr. | T = 4 h. Srf not changed |
| $Gd_{(1-m-n)}Hf_nCe_mBr_{(3+n)}$ | | | | | | | |
| $Gd_{0.979}Hf_{0.001}Ce_{0.02}Br_{3.001}$ | 35000 | 9.4 | 87 | 10 | 20 | slightly hygrosc. | T = 4 h. Srf clouded slightly, Srf structure not changed |
| $Gd_{0.948}Hf_{0.002}Ce_{0.05}Br_{3.002}$ | 38000 | 9.1 | 94 | 9.3 | 19 | nonhygr. | T = 4 h. Srf not changed |
| $Gd_{(1-m-n)}Hf_nCe_mCl_{(3+n)}$ | | | | | | | |
| $Gd_{0.948}Hf_{0.002}Ce_{0.05}Cl_{3.002}$ | 29000 | 12 | 95 | 12.1 | 22 | nonhygr. | T = 4 h. Srf not changed |
| $Gd_{0.988}Hf_{0.002}Ce_{0.01}Cl_{3.002}$ | 24000 | 12.8 | 96 | 13 | 20 | nonhygr. | T = 4 h. Srf not changed |
| $Lu_{(1-m-n)}Hf_nCe_mBr_{(3+n)}$ | | | | | | | |
| $Lu_{0.988}Hf_{0.002}Ce_{0.01}Br_{3.002}$ | 20000 | 7.5 | 93 | 7.7 | 32 | nonhygr. | T = 4 h. Srf not changed |
| $Lu_{0.948}Hf_{0.002}Ce_{0.05}Br_{3.002}$ | 27000 | 6.4 | 94 | 6.6 | 30 | nonhygr. | T = 4 h. Srf not changed |
| $Lu_{(1-m-n)}Hf_nCe_mI_{(3+n)}$ | | | | | | | |
| $Lu_{0.988}Hf_{0.002}Ce_{0.01}I_{3.002}$ | 50000 | 4.2 | 56 | 7.3 | 27 | hygrosc. AA | T = 3 h. Srf clouded, Srf structure changed |
| $Lu_{0.986}Hf_{0.004}Ce_{0.01}I_{3.004}$ | 45000 | 4.4 | 96 | 4.5 | 30 | nonhygr. | T = 4 h. Srf not changed |

TABLE 1-continued

| Compound 1 | Light yield (photon/MeV) 2 | ER for Cs137 3 | Light yield after exposure (percent) 4 | ER after exposure 5 | DT (ns) 6 | Hygroscopicity 7 | Time of exposure Srf changes 8 |
|---|---|---|---|---|---|---|---|
| $Y_{(1-m-n)}Hf_nCe_mI_{(3+n)}$ | | | | | | | |
| $Y_{0.948}Hf_{0.002}Ce_{0.05}I_{3.002}$ | 42000 | 4.5 | 95 | 4.6 | 35 | nonhygr. | T = 4 h. Srf not changed |
| $Y_{0.946}Hf_{0.004}Ce_{0.05}I_{3.004}$ | 43000 | 4.6 | 96 | 4.7 | 36 | nonhygr. | T = 4 h. Srf not changed |

For better visualization and comparison the properties of the crystal scintillator of the general formula $Ln_{(1-m)}Ce_mA_3$: $n \cdot Hf^{4+}$ are grouped in Table 2 below.

TABLE 2

$Ln_{(1-m)}Ce_mA_3: n \cdot Hf^{4+}$

| Matrix material 1 | n (mol %) 2 | Light yield (photon/MeV) 3 | ER for Cs137 4 | Light yield after exposure (percent) 5 | ER after exposure 6 | DT (ns) 7 | Hygroscopicity 8 | Time of exposure Srf changes 9 |
|---|---|---|---|---|---|---|---|---|
| $La_{0.95}Ce_{0.05}Br_3$ | 0 | 63000 | 2.8 | 40 | 6.3 | 18 | hygrosc. | T = 2 h. Srf clouded, Srf structure changed |
| $La_{0.95}Ce_{0.05}Br_3$ | 0.2 | 62000 | 2.8 | 96 | 2.9 | 18 | nonhygr. | T = 4 h. Srf not changed |
| $La_{0.99}Ce_{0.01}Br_3$ | 0.4 | 60000 | 2.9 | 96 | 3.0 | 20 | nonhygr. | T = 4 h. Srf not changed |
| $La_{0.95}Ce_{0.05}Br_3$ | 1.5 | 60000 | 3.0 | 97 | 3.1 | 21 | nonhygr. | T = 4 h. Srf not changed, crystal colored |
| $La_{0.90}Ce_{0.10}Cl_3$ | 0 | 45000 | 3.8 | 50 | 7 | 20 | hygrosc. | T = 2 h. Srf clouded, Srf structure changed |
| $La_{0.92}Ce_{0.08}Cl_3$ | 0.1 | 44000 | 4.2 | 90 | 4.6 | 21 | slightly hygrosc. | T = 4 h. Srf slightly clouded, Srf structure not changed |
| $La_{0.92}Ce_{0.08}Cl_3$ | 0.4 | 43000 | 4.3 | 94 | 4.4 | 22 | nonhygr. | T = 4 h. Srf not changed |
| $La_{0.92}Ce_{0.08}Cl_3$ | 1.5 | 41000 | 4.4 | 96 | 4.5 | 22 | nonhygr. | T = 4 h. Srf not changed, crystal colored |
| $La_{0.95}Ce_{0.05}I_3$ | 0 | 31000 | 5.3 | 48 | 7.2 | 24 | hygrosc. AA | T = 2 h. Srf clouded, Srf structure changed |
| $La_{0.95}Ce_{0.05}I_3$ | 0.5 | 30000 | 5.4 | 95 | 5.5 | 24 | nonhygr. | T = 4 h. Srf not changed |
| $Gd_{0.98}Ce_{0.02}Br_3$ | 0.1 | 35000 | 9.4 | 87 | 10 | 20 | slightly hygrosc. | T = 4 h. Srf slightly clouded, Srf structure not changed |
| $Gd_{0.95}Ce_{0.05}Br_3$ | 0.2 | 38000 | 9.1 | 94 | 9.3 | 19 | nonhygr. | T = 4 h. Srf not changed |
| $Gd_{0.95}Ce_{0.05}Cl_3$ | 0.2 | 29000 | 12 | 95 | 12.1 | 22 | nonhygr. | T = 4 h. Srf not changed |
| $Gd_{0.99}Ce_{0.01}Cl_3$ | 0.2 | 24000 | 12.8 | 96 | 13 | 20 | nonhygr. | T = 4 h. Srf not changed |
| $Lu_{0.99}Ce_{0.01}Br_3$ | 0.2 | 20000 | 7.5 | 93 | 7.7 | 32 | nonhygr. | T = 4 h. Srf not changed |
| $Lu_{0.95}Ce_{0.05}Br_3$ | 0.2 | 27000 | 6.4 | 94 | 6.6 | 30 | nonhygr. | T = 4 h. Srf not changed |
| $Lu_{0.99}Ce_{0.01}I_3$ | 0.1 | 50000 | 4.2 | 56 | 7.3 | 27 | hygrosc. AA | T = 3 h. Srf clouded, Srf structure changed |
| $Lu_{0.99}Ce_{0.01}I_3$ | 0.4 | 45000 | 4.4 | 96 | 4.5 | 30 | nonhygr. | T = 4 h. Srf not changed |

TABLE 2-continued $$Ln_{(1-m)}Ce_mA_3: n \cdot Hf^{4+}$$

| Matrix material 1 | n (mol %) 2 | Light yield (photon/MeV) 3 | ER for Cs137 4 | Light yield after exposure (percent) 5 | ER after exposure 6 | DT (ns) 7 | Hygroscopicity 8 | Time of exposure Srf changes 9 |
|---|---|---|---|---|---|---|---|---|
| $Y_{0.95}Ce_{0.05}I_3$ | 0.2 | 42000 | 4.5 | 95 | 4.6 | 35 | nonhygr. | T = 4 h. Srf not changed |
| $Y_{0.95}Ce_{0.05}I_3$ | 0.4 | 43000 | 4.6 | 96 | 4.7 | 36 | nonhygr. | T = 4 h. Srf not changed |

The scintillating material of the invention can be used to advantage, particularly, as the scintillating element of a radiation detector, e.g. gamma-ray and/or X-ray detector. The radiation detector according to the invention comprises a scintillating element coupled to a photo-detector responsible for producing electrical signals proportional to the number and intensity of the light pulses produced by the scintillating element. The photo-detector of the radiation detector may in particular be a photomultiplier, or else a photodiode, or else a CCD sensor.

The preferred use of the detectors of the present invention is for detection of ionizing radiation both in the form of electromagnetic waves of low energies and gamma-rays, X-rays, cosmic rays and particles. The detectors may be helpful in fundamental physics, in computer-aided tomography, in PET devices, in PET scanners with Time of Flight capabilities, in hand-held gamma spectrometers, cargo scanners, oil well logging systems, radiation monitoring applications, and also in combination with fibre-optic lines transmitting light flashes to a remote recorder (a photomultiplier or a photodiode).

The invention claimed is:

1. Inorganic halide-type scintillating material of formula $$Ln_{(1-m-n)}Hf_nCe_mA_{(3+n)},$$

wherein A is either Br or Cl, or I, or a mixture of at least two halogens of the group,
Ln is an element from the group: La, Nd, Pm, Sm, Eu, Gd, Tb, Lu, Y,
m is the molar level of substitution of Ln by cerium,
n is the molar level of substitution of Ln by hafnium,
m and n are numerical values greater than 0 and less than 1, the sum (m+n) is less than 1.

2. The material of claim 1, wherein m is greater than or equal to 0.0005 and less than or equal to 0.3.

3. The material of claim 1, wherein n is greater than or equal to 0.0005 and less than or equal to 0.015.

4. The material of claim 1, wherein Ln is lanthanum (La).

5. The material of claim 4, wherein A is bromine (Br).

6. The material of claim 5, wherein m is preferably greater than or equal to 0.005 and less than or equal to 0.1.

7. The material of claim 6, wherein n is preferably greater than or equal to 0.002 and less than or equal to 0.01.

8. The material of claim 1, wherein the material is a single crystal.

9. The material of claim 8, wherein the volume of the single crystal is at least 10 mm³.

10. The material of claim 1, wherein it is in the form of a powder.

11. The material of claim 1, wherein it is either packed or sintered or mixed with a binder.

12. Crystal scintillator represented by the formula $$Ln_{(1-m)}Ce_mA_3 \cdot n\text{-}Hf^{4+}$$

wherein $Ln_{(1-m)}Ce_mA_3$ represents the chemical composition of the matrix material,
A is either Br or Cl, or I, or a mixture of at least two halogens of the group, Ln is an element from the group: La, Nd, Pm, Sm, Eu, Gd, Tb, Lu, Y,
$Hf^{4+}$ is a dopant,
m is a numerical value greater than 0 and less than or equal to 0.3,
n is the $Hf^{4+}$ dopant content (mol %), preferably 0.05 mol %-1.5 mol %.

13. The crystal scintillator of claim 12, wherein Ln is lanthanum (La).

14. The crystal scintillator of claim 12, wherein A is bromine (Br).

15. The crystal scintillator of claim 12, which is a single crystal.

16. The crystal scintillator of claim 15, wherein Ln is lanthanum (La).

17. The crystal scintillator of claim 16, wherein A is bromine (Br).

18. The crystal scintillator of claim 17, wherein its volume is at least 10 mm³.

19. A radiation detector comprising a scintillating element based on inorganic scintillating material of claim 1 and a photo-detector coupled to the scintillating element and doing the job of forming electrical signals in response to the light pulses produced by the scintillating element.

20. The radiation detector of claim 19, wherein the scintillating element is based on a single crystal.

21. The radiation detector of claim 20, wherein the volume of the single crystal is at least 10 mm³.

22. The radiation detector of claim 19, wherein the scintillating element is made based on the scintillating material in the form of a powder (e.g. polycrystalline).

23. The radiation detector of claim 19, wherein the scintillating element is made based on a previously compacted scintillating material which is either packed or sintered or mixed with a binder.

24. The radiation detector of claim 19, wherein the photo-detector is either a photomultiplier or a photodiode.

* * * * *